US011125834B2

(12) United States Patent
Colarossi et al.

(10) Patent No.: US 11,125,834 B2
(45) Date of Patent: Sep. 21, 2021

(54) DIAGNOSIS OF SQUIB LOOP LEAKAGE RESISTANCE

(71) Applicant: Autoliv ASP, Inc., Ogden, UT (US)

(72) Inventors: Vincent Colarossi, Dearborn Heights, MI (US); Stuart Koch, West Bloomfield, MI (US)

(73) Assignee: VEONEER US, INC., Southfield, MI (US)

( * ) Notice: Subject to any disclaimer, the term of this patent is extended or adjusted under 35 U.S.C. 154(b) by 68 days.

(21) Appl. No.: 15/940,611

(22) Filed: Mar. 29, 2018

(65) Prior Publication Data

US 2019/0257872 A1  Aug. 22, 2019

Related U.S. Application Data

(60) Provisional application No. 62/632,874, filed on Feb. 20, 2018.

(51) Int. Cl.
| | | |
|---|---|---|
| *G01R 31/00* | (2006.01) | |
| *G01R 31/52* | (2020.01) | |
| *B60R 21/017* | (2006.01) | |
| *G06F 1/03* | (2006.01) | |
| *G01R 31/58* | (2020.01) | |
| *G01R 31/50* | (2020.01) | |

(52) U.S. Cl.
CPC ......... *G01R 31/52* (2020.01); *B60R 21/0173* (2013.01); *G01R 31/006* (2013.01); *G01R 31/50* (2020.01); *G01R 31/58* (2020.01); *G06F 1/03* (2013.01)

(58) Field of Classification Search
CPC .... G01R 31/025; G01R 31/006; G01R 19/04; B60R 21/0173
See application file for complete search history.

(56) References Cited

U.S. PATENT DOCUMENTS

| | | | |
|---|---|---|---|
| 4,285,148 A | 8/1981 | Kolar | |
| 4,825,148 A | 4/1989 | McCurdy et al. | |
| 5,459,449 A | 10/1995 | Raves, Jr. et al. | |
| 5,872,460 A * | 2/1999 | Bennett | B60R 21/0173 280/735 |
| 6,084,439 A * | 7/2000 | Sculley | H03K 5/1532 327/59 |
| 6,320,389 B1 | 11/2001 | Tamesue et al. | |
| 2003/0117018 A1 * | 6/2003 | Young | B60R 21/01546 307/10.1 |
| 2008/0086250 A1 | 4/2008 | Kuivenhoven | |

(Continued)

OTHER PUBLICATIONS

International Search Report for International Application No. PCT/US2019/018406, dated Apr. 24, 2019, 2 pgs.

*Primary Examiner* — Son T Le
*Assistant Examiner* — Adam S Clarke
(74) *Attorney, Agent, or Firm* — Dickinson Wright PLLC

(57) ABSTRACT

A method and system for diagnosing the squib leakage resistance through a restraint control module is disclosed in the present application. The newly proposed system and method provides a highly accurate measurement by minimizing/eliminating the effect of the unknown source voltage effects. The concept utilizes the squib leakage resistance diagnostic resources with a multi-step measurement approach, for example utilizing measurements of two currents and/or two voltages.

20 Claims, 4 Drawing Sheets

(56) References Cited

U.S. PATENT DOCUMENTS

| | | | | |
|---|---|---|---|---|
| 2013/0134985 A1* | 5/2013 | Bernardon | ............. | G01R 31/40 |
| | | | | 324/527 |
| 2013/0317701 A1* | 11/2013 | Ooyabu | ................ | B60R 21/013 |
| | | | | 701/45 |
| 2015/0293164 A1* | 10/2015 | Stephenson | .......... | G01R 31/025 |
| | | | | 324/509 |
| 2019/0047502 A1* | 2/2019 | Lamesch | ................ | B60N 2/002 |

* cited by examiner

DIAGNOSIS OF SQUIB LOOP LEAKAGE RESISTANCE

RELATED APPLICATIONS

The present patent document claims the benefit of the filing date under 35 U.S.C. § 119(e) of Provisional U.S. Patent Application Ser. No. 62/632,874, filed Feb. 20, 2018, which is hereby incorporated by reference.

BACKGROUND

The present application relates generally to a method and system for diagnosing squib leakage resistance.

An airbag system typically includes a restraint control module, a reaction canister, an air bag, and an inflator with ignitor (squib) that are stored inside the reaction canister. The inflator with squib is connected to the restraint control module via conductive wires and connectors. The total electrical path of these wires and connectors to and from the inflator is termed "squib loop". The restraint control module provides sufficient energy to the inflator through the squib loop to provide airbag actuation. The inflator is actuated by the restraint control module once appropriate signals received from vehicle sensors are sufficient to warrant airbag activation. The restraint control module controls the overall operation of the air bag system and can be viewed as the main control unit for the air bag system.

As with any electrical system that consists of sensors, airbag, wiring and connectors etc, the system requires electrical connections to operate properly. Specifically, in airbag safety systems customers demand that diagnostic capability be implemented in the restraint control module to interrogate the squib loop characteristics, that may prevent the air bag from being activated properly. An example of one squib loop characteristic is the squib leakage resistance.

BRIEF SUMMARY

A method and system for diagnosing the squib leakage resistance through a restraint control module is disclosed in the present application. The newly proposed system and method provides a highly accurate measurement by minimizing/eliminating the effect of the unknown source voltage effects. The concept utilizes the squib leakage resistance diagnostic resources with a multi-step measurement approach, for example utilizing measurements of two currents and/or two voltages.

Further objects, features and advantages of this application will become readily apparent to persons skilled in the art after a review of the following description, with reference to the drawings and claims that are appended to and form a part of this specification.

BRIEF DESCRIPTION OF THE DRAWINGS

In the accompanying drawings the components are not necessarily to scale, emphasis instead being placed upon illustrating the principles of the application. Moreover, like reference numerals designate corresponding parts throughout the views.

DETAILED DESCRIPTION

Figure 1:
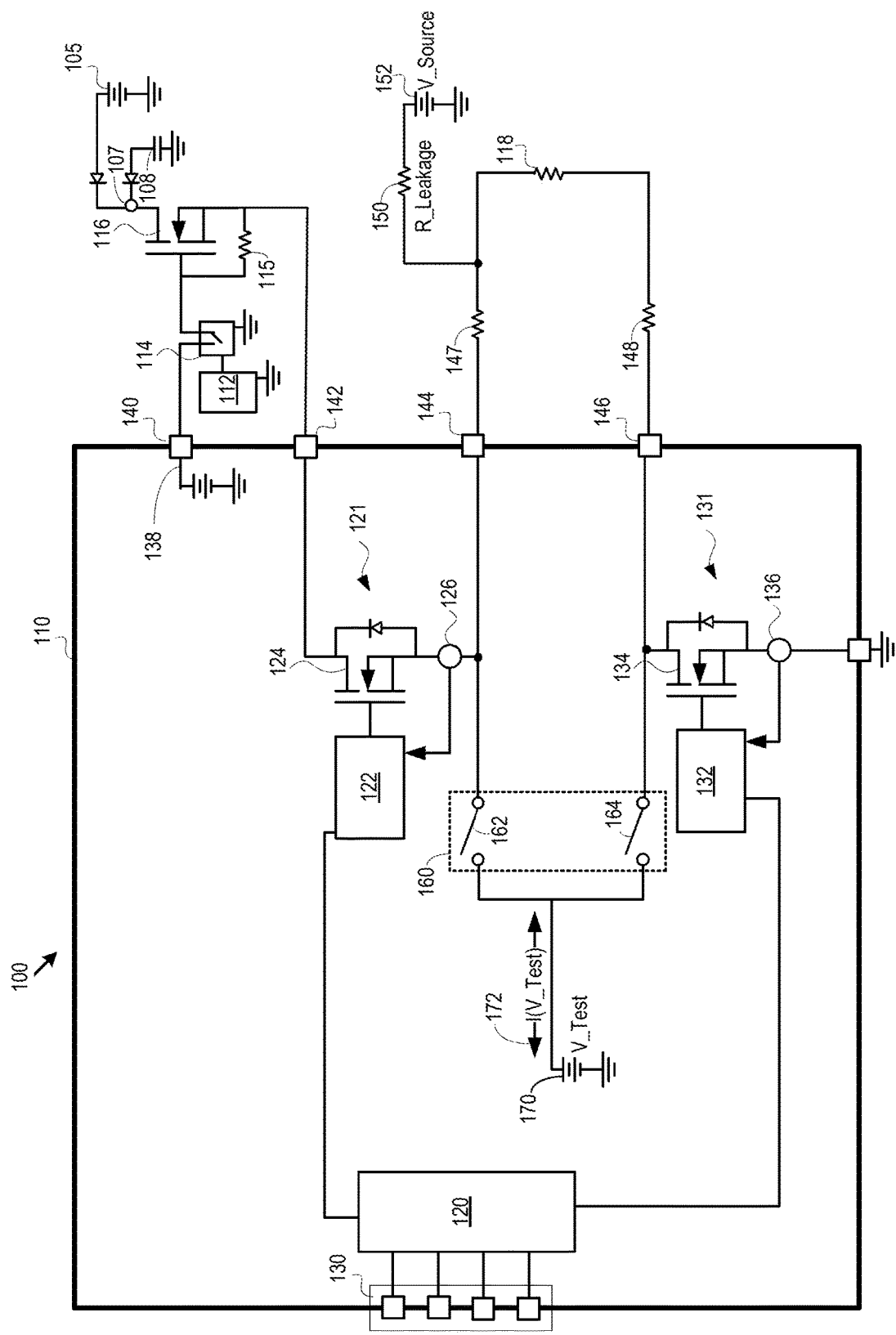
FIG. 1 is a schematic view of one implementation of a squib driver circuit.

Airbag safety restraint systems typically employ a single inflator device to produce inflation gas for inflating a vehicle occupant restraint airbag the event of a collision. The inflator device is controlled by a squib driver circuit. The squib driver circuit may include a high side driver and as low side driver implemented on a single deployment chip. Squib leakage resistance represents an electrical circuit path that can divert the squib driver current from the squib. The squib leakage resistance could come from a variety of sources such as damaged wires, connectors or components within the system. In addition, the squib leakage resistance path can also include voltages for example −1V to 19V. This unknown voltage range may severely impact the variation of the squib leakage measurements to detect the faulty circuit path. The main source of squib leakage resistance variation/uncertainty is the unknown source voltage range connected to the squib leakage resistance.

The newly proposed method for diagnosis of squib leakage resistance, provides a highly accurate measurement by minimizing/eliminating the effect of the unknown source voltage effects. The concept utilizes the squib leakage resistance diagnostic resources with a two-step measurement approach for example utilizing measurements of two currents and two voltages.

This new proposal will provide a highly accurate squib leakage resistance measurement concept independent of the squib leakage resistance source value (e.g. the voltage to which the squib leakage resistance is connected). A secondary calculation using the calculated value of the squib leakage resistance and measured voltages and currents can then be used solve for the unknown source voltage value as well. The testing voltage source (V_Test) may be a single voltage supply that can be set to multiple distinct voltages or multiple sources that are switched. In either scenario the current provided by the test voltage source may be measured at multiple distinct voltages to minimize leakage source effects. These effects may be problematic when the squib leakage resistance is connected (e.g. shorted or partially shorted) to a voltage other than ground (0V).

The test may be performed by using a switch to connect the test voltage to the feed line of the squib loop. The current provided to the feed line may be measured at each of the test voltages. The test voltages may be inferred based on the control setting or independently measured by the test system. The test also may be performed by using a switch to connect the test voltage to the return line of the squib loop. The current provided to the return line may be measured at each of the test voltages. In some instances, the test may be performed on the feed line, then disconnected from the feed line and tested on the return line sequentially. Also, it is contemplated that in some implementations a combination of the feed line or return line may be used in combination at various different voltages.

Taking measurements at the two test voltages may provide blind zone elimination. For example, if the resistance is checked with a single test voltage that is the same as the leak voltage (V_Source) to which the squib leakage resistance is connected, then the squib leakage resistance will not be detected because no current will flow through the squib leakage resistance, resulting in a very high or infinite squib leakage resistance value.

FIG. 1 is a schematic illustration of a squib driver circuit 100. The squib driver circuit includes a deployment chip 110. The deployment chip 110 may be a single silicon chip, for example, an ASIC (Application Specific Integrated Circuit). The deployment chip 110 may include an input terminal ($SS_{xy}$) 142 for receiving an input voltage. The input voltage may be used to fire a deployable restraint such as an air bag. The input terminal ($SS_{xy}$) 142 may receive the input voltage from a battery such as vehicle battery 105. A switch 116 such as the power transistor may be located between the input terminal ($SS_{xy}$) 142 and the battery 105. The battery 105 may be connected to the switch 116 through a diode, further the switch may be connected to an electrical ground though a diode and capacitor ($C_{ER}$) 108.

The switch 116 may control power provided to the input terminal 142 from the battery 105 as directed by an enable switch 114. The enable switch 114 may receive enable voltage 138 from an output terminal (VSF) 140 of the deployment chip 110. The output voltage may be provided from the output terminal 140 (VSF) to the enable switch 114. The microprocessor control circuit 112 may control the enable switch 114. When the enable switch 114 is active, the enable voltage may be provided to activate switch 116 allowing the battery 105 to provide power to the input terminal ($SS_{xy}$) 142. In some implementations, the enable switch 114 may be connected to the gate of a power transistor thereby acting as a switch or regulator allowing the battery 105 to provide power to the input terminal ($SS_{xy}$) 142. In some implementations, the switch 116 may be an N-channel MOSFET with a drain in connection with the battery 105 and a source in connection with the input terminal ($SS_{xy}$) 142. Resistor 115 may be connected between the source and the gate of switch 116. In this implementation, a resistor may be placed between the gate and source to allow proper operation. The switch 116 can be a MOSFET that provides two functions: Firstly, switch 116 can provide a redundant silicon control path that can prevent deployment in case of system failure where, for example Switch 116 is disabled and switches 124 and 134 of deployment chip 110 become active due to a common failure mode. Secondly, switch 116 can provide a reduced and more controlled V($SS_{xy}$,0) 142 when implemented as a pass element part of a closed loop regulator control path and hence absorb more power and provide a lower level of power dissipation on the expensive ASIC squib driver transistors to minimize system cost.

The input terminal ($SS_{xy}$) 142 may be connected to a high side driver circuit 121. The high side driver circuit 121 may be connected between the input terminal 142 and the high side feed terminal 144. In one implementation, a power transistor 124 may be connected between the input terminal ($SS_{xy}$) 142 and the high side feed terminal ($SF_x$) 144. The power transistor 124 may be an N-channel MOSFET with a drain connected to the input terminal ($SS_{xy}$) 142 and a source connected to the high side feed terminal ($SF_x$) 144. A gate of the power transistor 124 may be connected to a high side gate driver circuit 122. In some implementations, a current sensor 126 may provide a current signal to the high side gate driver circuit 122. The gate driver circuit 122 may utilize the current signal to control activation of the power transistor 124 in response to the amount of current flow. The current sensor 126 may be located between the power transistor 124 and the high side feed terminal ($SF_x$) 144. The high side feed terminal ($SF_x$) 144 may be connected to an ignitor (R_ignitor) 118 through a feed wire (R_Wire_Feed) 147. The current may be returned from the ignitor 118 through a return wire (R_Wire_Return) 148 to a low side return terminal ($SR_x$) 146.

A low side driver circuit 131 may be connected between the low side return terminal 146 and an electrical ground. In one implementation, a power transistor 134 may be connected between the return terminal ($SR_x$) 146 and the electrical ground. The power transistor 134 may be an N-channel MOSFET with a drain connected to the return terminal ($SR_x$) 146 and a source connected to the electrical ground. A gate of the power transistor 134 may be connected to a low side gate driver circuit 132. In some implementations, a current sensor 136 may provide a current signal to the low side gate driver circuit 132. The gate driver circuit 132 may utilize the current signal to control activation of the power transistor 134 in response to the amount of current flow. The current sensor 136 may be located between the power transistor 134 and the electrical ground.

A digital control circuit 120 may receive commands from a communication interface 130, such as a serial communication interface. The commands provided to the digital circuit 120 through the communication interface 130 may include an enable command, an all fire command, as well as various configuration commands to set timer durations or thresholds for various components such as the high side gate driver 122 or the low side gate driver 132.

The squib leakage resistance (R_Leakage) 150 in the squib loop may be connected to ground or may be connected to a leak voltage (V_Source) 152, shown schematically as a voltage source. The chip 110 may include a test voltage source (V_Test) 170 and switch unit 160. The switch unit 160 may include a first switch 162 configured to connect or isolate the test voltage source (V_Test) 170 from the high side feed terminal ($SF_x$) 144. The switch unit 160 may include a second switch 164 configured to connect or isolate the test voltage source (V_Test) 170 from a low side return terminal ($SR_x$) 146. The test voltage source (V_Test) 170 may be a single voltage supply that can be set to multiple distinct voltages or multiple sources of different voltage that are switched. In either scenario the current provided by the test voltage source may be measured at multiple distinct voltages to minimize leakage source effects. These effects may be problematic especially when the squib leakage resistance (R_Leakage) 150 is connected (e.g. shorted or partially shorted) to a voltage other than ground, such as leak voltage (V_Source) 152. The current [I(V_Test)] 170 provided by the test voltage source (V_Test) 170 to the squib loop may be measured to determine the value of the squib leakage resistance (R_Leakage) 150 and/or the value of the leak voltage (V_Source) 152.

Figure 2:
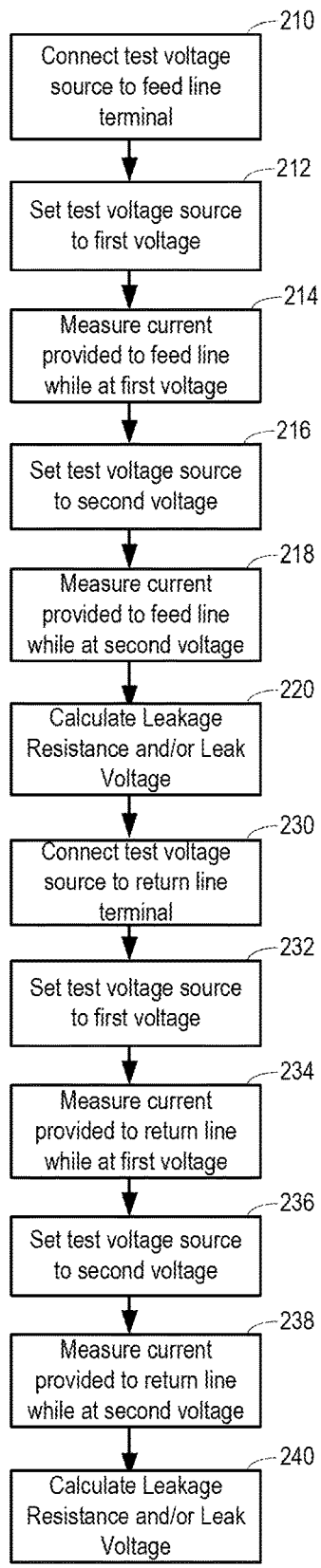
FIG. 2 is a flowchart illustrating a method for testing the squib leakage resistance.

FIG. 2 is a flowchart illustrating a method for testing the squib loop leakage resistance. The method starts in block 210. In block 210, the test voltage source (V_Test) is connected to the high side feed terminal ($SF_x$). At the same time, the voltage source (V_Test) may be isolated from the low side return terminal ($SR_x$). In block 212, the test voltage source (V_Test) is set to provide a first test voltage (V_Test_1) to the high side feed line terminal ($SF_x$). The current [I(V_Test_1)] that is provided to the high side feed line terminal ($SF_x$) from the test voltage source (V_Test) is measured in block 214; and the value is stored.

In block 216, the test voltage source (V_Test) is set to provide a second test voltage (V_Test_2) to the high side feed line terminal ($SF_x$). The current [I(V_Test_2)] that is provided to the high side feed line terminal ($SF_x$) from the test voltage source (V_Test) is measured in block 218; and the value is stored. The squib leakage resistance (R_Leakage) and/or the value of the leak voltage (V_Source) can be determined based on the measurements in block 220.

The leak voltage value may then be used to try and determine to what the squib leakage resistance is connected. For example, if the squib leakage resistance is connected to a certain voltage, that voltage may be indicative of a voltage used by a particular module, group of modules or a specific function. An operator may look for places where the wiring may short to that group of modules or function. A look up table may be able to provide a list of the modules or even a list of locations where such shorts may occur.

Making at least two measurements with either V_Test_1 & V_Test_2 or I(V_Test_2) & I(V_Test_1), where V_Test_2>V_Test1 results in the following:

$$V\_Source - I(V\_Test\_2) * R\_Leakage = V\_Test\_2 \quad \text{Eq1}$$

$$V\_Source - I(V\_Test\_1) * R\_Leakage = V\_Test\_1 \quad \text{Eq2}$$

Performing Eq1-Eq2 yields:

$$0 - I(V\_Test\_2) * R\_Leakage + I(V\_Test\_1) * R\_Leakage = V\_Test\_2 - V\_Test\_1$$

Solving for R_Leakage Yields:

$$R\_Leakage = (V\_Test\_2 - V\_Test\_1)/(I(V\_Test\_1) - I(V\_Test\_2))$$

Please note that now the value of R_Leakage is independent of the V_Source Value.

Once the value or R_Leakage is calculated, the value of R_Leakage can be inserted into Eq1 or Eq2 to calculate the value of the V_Source.

Using Eq1 and solving for V_Source yields:

$$V\_Source = V\_Test\_2 + I(V\_Test\_2) * R\_Leakage$$

In a similar manner Using Eq2 yields:

$$V\_Source = V\_Test\_1 + I(V\_Test\_1) * R\_Leakage$$

V_Test_1 is the first test voltage, I(V_Test_1) is the current at the first test voltage, V_Test_2 is the second test voltage, I(V_Test_2) is the current at the second test voltage, R_Leakage is the resistance value of the squib leakage resistance, V_Source is the voltage value to which the squib leakage resistance is connected.

Alarms may be sent if the squib leakage resistance (R_Leakage) or the leak voltage (V_Source) are outside of a respective threshold range. Further, the squib leakage resistance (R_Leakage) or the leak voltage (V_Source) values may be compared to a look up table or other data store to identify one or more possible failure modes based on one or both of the values.

In block 230, the test voltage source (V_Test) is connected to the low side return terminal ($SR_x$). At the same time, the voltage source (V_Test) may be isolated from the high side feed line terminal ($SF_x$). In block 232, the test voltage source (V_Test) is set to provide a first test voltage (V_Test_1) to the low side return terminal ($SR_x$). The current [I(V_Test_1)] that is provided to the low side return terminal ($SR_x$) from the test voltage source (V_Test) is measured in block 234; and the value is stored.

In block 236, the test voltage source (V_Test) is set to provide a second test voltage (V_Test_2) to the low side return terminal ($SR_x$). The current [I(V_Test_2)] that is provided to the low side return terminal ($SR_x$) from the test voltage source (V_Test) is measured in block 238; and the value is stored. The squib leakage resistance (R_Leakage) and the value of the leak voltage (V_Source) can be determined based on the measurements in block 240. Alarms may be sent if the squib leakage resistance (R_Leakage) or the leak voltage (V_Source) are outside of a respective threshold range. Further, the squib leakage resistance (R_Leakage) or the leak voltage (V_Source) values may be compared to a look up table or other data store to identify one or more possible failure modes based on one or both of the values.

Figure 3:
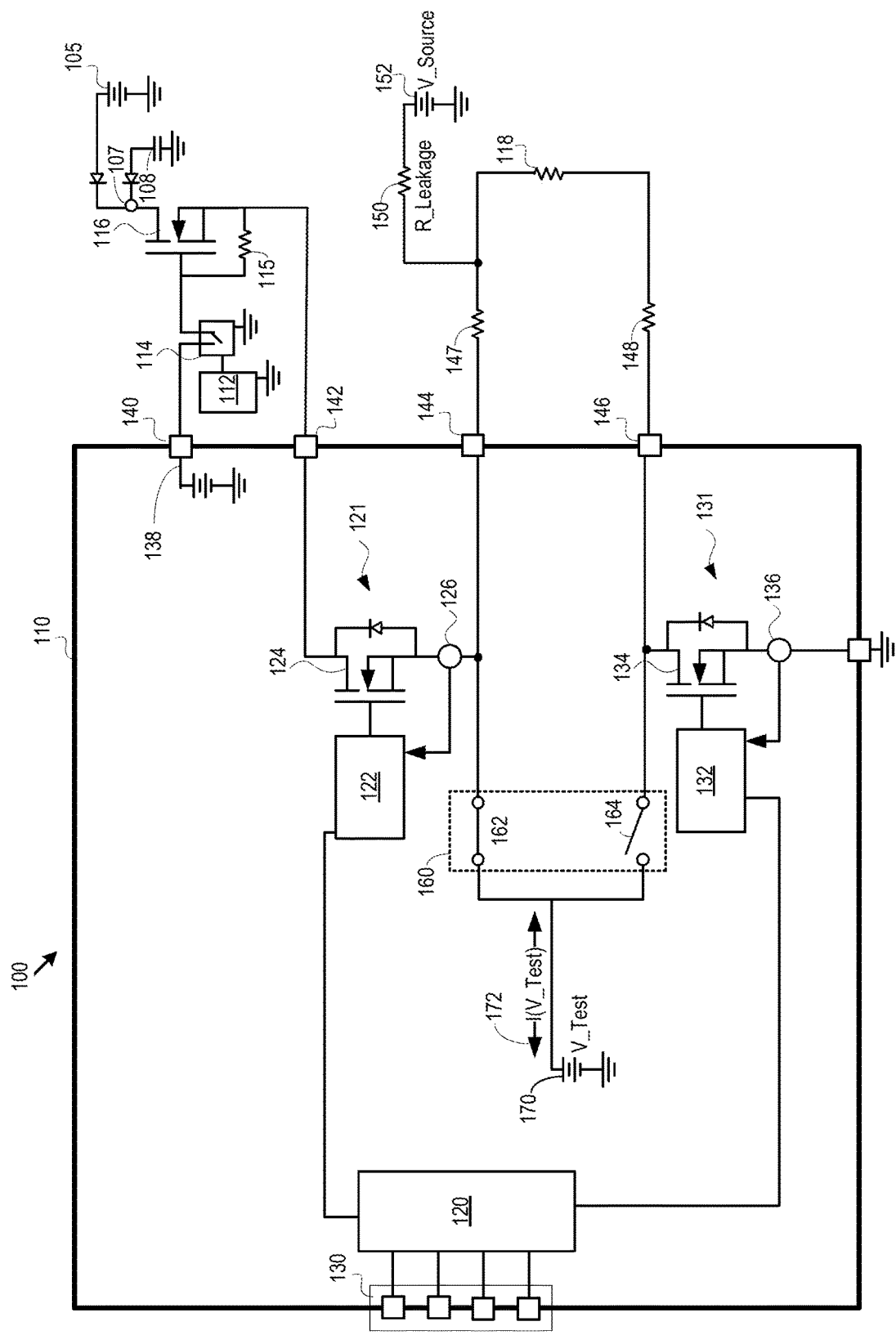
FIG. 3 is a schematic view of one implementation a squib driver circuit providing test voltages to the high side feed terminal.

FIG. 3 is a schematic view of one implementation a squib driver circuit providing test voltages to the high side feed terminal. The squib driver circuit may have switch 162 closed and switch 164 open to connect the test voltage source (V_Test) 170 to the high side feed terminal ($SF_x$) 144 and isolate the low side return terminal ($SR_x$) 146 from the test voltage source (V_Test) 170. This configuration may correspond to steps 210-220 in FIG. 2.

Figure 4:
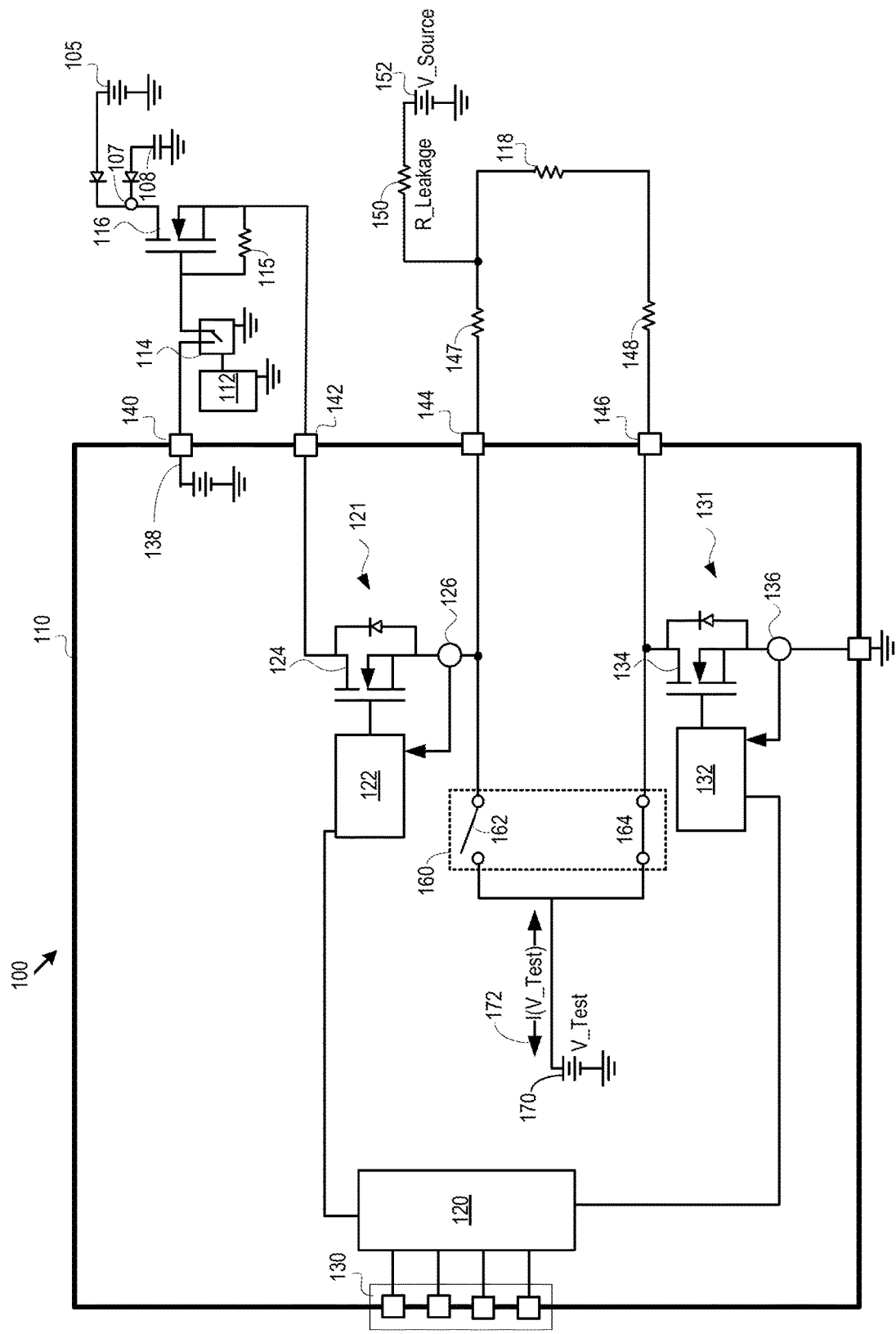
FIG. 4 is a schematic view of one implementation a squib driver circuit providing test voltages to the low side return terminal.

FIG. 4 is a schematic view of one implementation a squib driver circuit providing test voltages to the low side return terminal. The squib driver circuit may have switch 164 closed and switch 162 open to connect the test voltage source (V_Test) 170 to the low side return terminal ($SR_x$) 146 and isolate the high side feed terminal ($SF_x$) 144 from the test voltage source (V_Test) 170. This configuration may correspond to steps 230-240 in FIG. 2.

The methods, devices, processing, and logic described above may be implemented in many different ways and in many different combinations of hardware and software. For example, all or parts of the implementations may be circuitry that includes an instruction processor, such as a Central Processing Unit (CPU), microcontroller, or a microprocessor; an Application Specific Integrated Circuit (ASIC), Programmable Logic Device (PLD), or Field Programmable Gate Array (FPGA); or circuitry that includes discrete logic or other circuit components, including analog circuit components, digital circuit components or both; or any combination thereof. The circuitry may include discrete interconnected hardware components and/or may be combined on a single integrated circuit die, distributed among multiple integrated circuit dies, or implemented in a Multiple Chip Module (MCM) of multiple integrated circuit dies in a common package, as examples.

The circuitry may further include or access instructions for execution by the circuitry. The instructions may be stored in a tangible storage medium that is other than a transitory signal, such as a flash memory, a Random Access Memory (RAM), a Read Only Memory (ROM), an Erasable Programmable Read Only Memory (EPROM); or on a magnetic or optical disc, such as a Compact Disc Read Only Memory (CDROM), Hard Disk Drive (HDD), or other magnetic or optical disk; or in or on another machine-readable medium. A product, such as a computer program product, may include a storage medium and instructions stored in or on the medium, and the instructions when executed by the circuitry in a device may cause the device to implement any of the processing described above or illustrated in the drawings.

The implementations may be distributed as circuitry among multiple system components, such as among multiple processors and memories, optionally including multiple distributed processing systems. Parameters, databases, and other data structures may be separately stored and managed, may be incorporated into a single memory or database, may be logically and physically organized in many different ways, and may be implemented in many different ways, including as data structures such as linked lists, hash tables, arrays, records, objects, or implicit storage mechanisms. Programs may be parts (e.g., subroutines) of a single program, separate programs, distributed across several memories and processors, or implemented in many different ways, such as in a library, such as a shared library (e.g., a Dynamic Link Library (DLL)). The DLL, for example, may store instructions that perform any of the processing described above or illustrated in the drawings, when executed by the circuitry.

As a person skilled in the art will readily appreciate, the above description is meant as an illustration of the principles of this disclosure. This description is not intended to limit the scope or application of this disclosure in that the systems and methods are susceptible to modification, variation and change, without departing from spirit of this disclosure, as defined in the following claims.

The invention claimed is:

1. A system for diagnosing squib leakage resistance in a squib loop, the system comprising;
a high side driver connected to a firing voltage source and a feed line terminal for the squib loop;
a low side driver connected to a return line terminal for the squib loop and a ground;
a testing voltage source being configured to provide at least two distinct test voltages to the feed line terminal; and
a current measurement unit configured to measure a current provided by the testing voltage source to the feed line terminal when the testing voltage source is set to a first test voltage and measure a current provided by the testing voltage source to the feed line terminal when the testing voltage source is set to a second test voltage distinct from the first voltage.

2. The system according to claim 1, further comprising a circuit configured to determine a squib leakage resistance based on the current provided by the testing voltage source.

3. The system according to claim 1, further comprising a circuit configured to determine a leak voltage to which a leak resistance is connected based on the current provided by the testing voltage source.

4. The system according to claim 3, wherein the circuit is configured to determine an error type in response to the leak voltage.

5. The system according to claim 3, wherein the circuit is configured to determine an error type by accessing a look up table by the leak voltage.

6. The system according to claim 3, wherein the circuit is configured to set the testing voltage source to a first test voltage and measure a first current provided to the feed line terminal while the testing voltage source is set to the first testing voltage, then set the testing voltage source to a second test voltage and measure a second current provided to the feed line terminal while the testing voltage source is set to the second testing voltage.

7. The system according to claim 1, further comprising a testing switch is configured to connect and disconnect the testing voltage source to the feed line terminal.

8. The system according to claim 7, wherein the testing switch is configured to connect the testing voltage source to the feed line terminal when the first test voltage is provided and when the second test voltage is provided.

9. A method for diagnosing the squib leakage resistance in a squib loop, the method comprising the steps of:
providing a first test voltage to a feed line or a return line of the squib loop;
measuring a first current provided to the feed line or the return line when the first voltage is provided;
providing a second test voltage to the feed line or the return line of the squib loop;
measuring a second current provided to the feed line or the return line when the second voltage is provided; and
determine a squib leakage resistance in the squib loop based on the first current and the second current.

10. The method according to claim 9, further comprising determining a leak voltage to which the squib leakage resistance is connected based on the squib leakage resistance, the first test voltage and the second test voltage.

11. The method according to claim 10, further comprising determining at least one system to which the squib leakage resistance is connected in response to the leak voltage as determined by the first and second current measurements.

12. The method according to claim 11, further comprising issuing an alert if the squib leakage resistance is below a threshold leakage resistance.

13. A system for diagnosing squib leakage resistance in a squib loop, the system comprising;
a high side driver connected to a firing voltage source and a feed line terminal for the squib loop;
a low side driver connected to a return line terminal for the squib loop and a ground;
a testing voltage source being configured to provide at least two distinct test voltages;
a testing switch, the testing switch being configured to connect the testing voltage source to the return line terminal; and
a current measurement unit configured to measure the current provided by the testing voltage source to the return line terminal when the testing voltage source is set to a first test voltage and measure a current provided by the testing voltage source to the feed line terminal when the testing voltage source is set to a second test voltage distinct from the first voltage.

14. The system according to claim 13, further comprising a circuit configured to determine a squib leakage resistance based on the current provided by the testing voltage source.

15. The system according to claim 13, further comprising a circuit configured to determine a leak voltage to which a leak resistance is connected based on the current provided by the testing voltage source.

16. The system according to claim 15, wherein the circuit is configured to determine an error type in response to the leak voltage.

17. The system according to claim 15, wherein the circuit is configured to determine an error type by accessing a look up table by the leak voltage.

18. The system according to claim 15, wherein the circuit is configured to set the testing voltage source to a first test voltage and measure a first current provided to the feed line terminal while the testing voltage source is set to the first testing voltage, then set the testing voltage source to a second test voltage and measure a second current provided to the feed line terminal while the testing voltage source is set to the second testing voltage.

19. The system according to claim 13, further comprising a testing switch is configured to connect and disconnect the testing voltage source to the feed line terminal.

20. The system according to claim 19, wherein the testing switch is configured to connect the testing voltage source to the feed line terminal when the first test voltage is provided and when the second test voltage is provided.

* * * * *